July 24, 1962 W. A. BOSENBERG 3,046,176

FABRICATING SEMICONDUCTOR DEVICES

Filed July 25, 1958

INVENTOR.
WOLFRAM A. BOSENBERG
BY J. [signature]
ATTORNEY

United States Patent Office 3,046,176

Patented July 24, 1962

3,046,176

FABRICATING SEMICONDUCTOR DEVICES

Wolfram A. Bosenberg, Somerville, N.J., assignor to Radio Corporation of America, a corporation of Delaware Filed July 25, 1958, Ser. No. 751,046
9 Claims. (Cl. 156—11)

This invention relates to improved methods of fabricating semiconductor devices, and to improved devices made by the method.

In the fabrication of semiconductor devices such as diodes and transistors it is generally necessary to dice a relatively thin but large area slice or wafer of semiconductive material into a plurality of relatively small pellets. The wafer may, for example, be a transverse slice of a monocrystalline semiconductor ingot prepared by the Czochralski crystal pulling technique. The slices are commonly a few mils thick, and the wafer faces have an irregular shape with an area of the order of a square inch. The wafers are diced into regular pellets, which may for example be squares about 50 to 100 mils on edge.

Dicing of semiconductor wafers has been accomplished by means of thin diamond saws, which can be ganged to make parallel cuts over the entire wafer in a single operation. The wafer is generally bonded to a glass slide by such means as sealing wax, and the slide is held in place on the saw table. Another method of dicing semiconductor wafers depends on the brittleness of the material. The wafer is scratched or scored with a hard-pointed tool, just as glass is scratched for cutting, and is then broken up into a plurality of dice. An alternate method of dicing semiconductor slices uses a cutting tool in which a blade is vibrated vertically to the slice at very high frequency rates by means of a magnetostrictive drive. A fourth method consists of masking the wafer, and directing against the exposed portions of the wafer a stream of abrasive particles such as silicon carbide suspended in air or water. See, for example, Section 20 of "Transistors," Coblenz and Owens, McGraw-Hill, New York, 1955.

Dicing wafers by means of a single saw is too slow, and requires considerable hand labor. Dicing by means of a vibrating tool or an abrasive jet has the same disadvantages. Dicing by means of a ganged saw is faster, but introduces many chips, cracks and stains in the pellets, and hence a high rate of scrap. All three methods cause considerable loss of the expensive monocrystalline wafer material, since the cuts made must be at least as wide as the saw or tool or jet. Dicing the wafer by scoring and breaking is also slow, requires much hand labor, and results in considerable scrap due to chipping and cracking of the wafers.

It is therefore an object of this invention to provide an improved method of making semiconductor devices wherein a large wafer of semiconductive material must be divided into a number of smaller units.

Another object of this invention is to provide an improved method of dicing a semiconductive wafer into pellets.

These and other objects may be accomplished according to the instant invention which comprises a novel and improved method of fabricating semiconductor devices. Broadly, the invention provides an improved method of dicing a semiconductive wafer into pellets and simultaneously providing pellet surfaces suitable for the attachment of electrical leads. The method comprises the step of metallizing predetermined areas on at least one major face of the wafer so as to provide a relatively thin coating to which an etchant-resistant substance will adhere. The wafer is next dipped in the etchant-resistant substance, which may for example, be a molten metal such as lead, or a mixture of molten metals such as solder, which is resistant to the action of a semiconductor etchant to be used subsequently. The molten metal or solder will not "wet" the semiconductor, but will adhere to the metallized areas of the wafer and form a relatively thick protective layer only on the metallized portions of the wafer surface. The wafer is then immersed in a suitable etchant which dissolves those portions of the slice between the areas covered by the protective layer, thus forming a plurality of pellets coated with a relatively thick metal layer on one face and corresponding in size and shape to the metallized areas on the original wafer. Since the metal layer is both thermally and electrically conductive, it may be utilized to mount the pellet on a base plate. Alternatively, electrical leads may be attached to the pellet by soldering them to the metal layer. The instant method thus uses the metal coating for a two-fold purpose as a mask in dicing the wafer and as a solderable surface. In another embodiment of the invention, metallization of predetermined areas in registry on opposite major wafer faces is effected. The pellets thereby produced are coated with metal on opposite major faces, and are particularly suitable for diodes.

The invention will be described in greater detail with reference to the drawing, of which:

Figure 1:
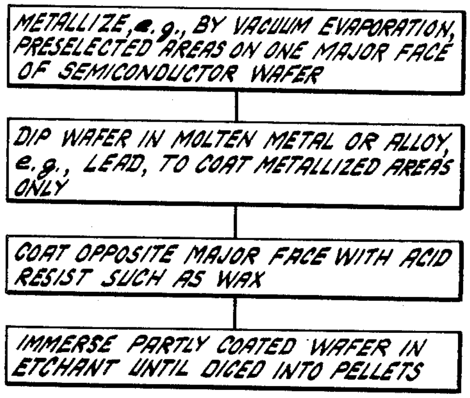
FIGURE 1 is a chart indicating the principal steps in the fabrication of semiconductor pellets in accordance with the methods of this invention.

As represented in FIGURE 1, in the methods of this invention, preselected areas on major faces of a semiconductor wafer or slice are metallized by any convenient process. The wafer material may be any of the conventional solid crystalline semiconductors, such as elemental silicon, germanium-silicon alloys, or compound semiconductors such as silicon carbide, the phosphides, arsenides and antimonides of aluminum, gallium and indium, and the sulfides, selenides and tellurides of zinc, cadmium and mercury. In this example, the semiconductor is silicon. The metal used is preferably chemically and electrically inert with respect to the particular semiconductor, and may, for example, be selected from the group consisting of cobalt, nickel, copper, rhodium, palladium, silver, iridium, platinum and gold. In this example, the silicon wafer is metallized with rhodium, and the metallized areas are squares 50 mils on edge.

Metallization of the preselected areas of the wafer may be accomplished by any convenient technique after masking at least one major wafer face. In this example, one major wafer face is suitably masked to expose predetermined areas, and the opposite face is completely covered. The masked silicon wafer is placed in an evacuated chamber. A rhodium pellet within the chamber is heated by means of a tungsten wire so that the rhodium evaporates and forms a thin film over the unmasked portions of the masked major face of the silicon wafer.

The semiconductor wafer is next dipped in a molten metal. The metal is selected from the group which are chemically inert with respect to the particular semiconductor. It is preferable that the melting point of the metal is lower than that of the semiconductor, and that the metal is electrically inert, i.e., does not introduce donor or acceptor impurities into the wafer. Lead and tin are examples of suitable metals for the purpose. Alloys such as lead-tin solder may also be used. In this example, the molten metal consists of lead. The exposed portions of the silicon wafer are not affected, since the molten metal does not "wet" silicon. However, the preselected areas of the wafer which were metallized by the rhodium film are "wet" by the molten lead, and hence are covered by a relatively thick lead coating.

The wafer is then coated with wax on the face opposite the masked face and immersed in a suitable etchant which is capable of dissolving the wafer material but is relatively inert with respect to lead. In this example, the etchant is composed of equal portions of concentrated nitric acid and concentrated hydrofluoric acid. The acid dissolves those potrions of the silicon wafer which are not covered by a lead coating, but is relatively inert with respect to lead. In practice, a number of the partly coated silicon slices are dropped in a beaker of the etchant, and are left for about 5 minues. During this period the portions of the wafer not protected by a lead coating are dissolved, and the wafer separates into a plurality of silicon pellets which have one major face coated with lead. In this example, the major pellet faces are squares 50 mils on edge. The size and shape of the pellet major faces always correspond to the size and shape of the preselected metallized areas of the wafer.

The lead coated face of each pellet may be utilized as a solderable surface for attaching electrical connecting wires. Alternatively, the pellet may be mounted on a base plate by means of the lead coating, and the opposite face of the silicon pellet can be treated either by diffusing vaporized impurities therein or alloying electrode dots thereto so as to form transistors and other devices.

Figure 2:
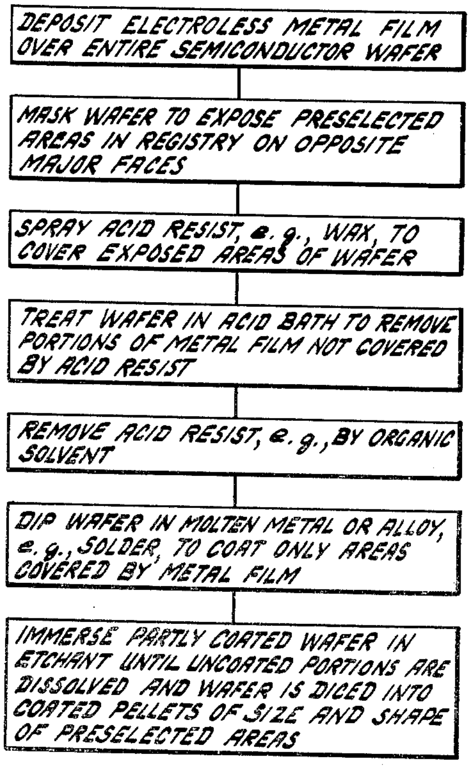
FIGURE 2 is a chart indicating the steps in the dicing of semiconductor wafers in accordance with one embodiment of the invention.

In another embodiment of the invention, which is represented in FIGURE 2, the entire surface of the semiconductor wafer is metallized. Portions of the metal film are then removed, so as to leave a pattern of preselected metallized areas in registry on the opposite major wafer faces. The process will be described with reference to the fabrication of silicon diodes, but it will be understood that this is by way of example only and not by way of limitation, since the invention is equally applicable to the other solid crystalline semiconductor materials such as those mentioned above, and to the fabrication of other semiconductor devices such as transistors.

The manufacture of diodes in accordance with this embodiment begins with the introduction of a PN junction into a slice of monocrystalline silicon. This may be accomplished by preparing a slice about 6 to 10 mils thick cut from a single crystal of P-type silicon, and heating the slice in an atmosphere of phosphorus pentoxide. The phosphorus is a donor and diffuses into the silicon slice to form an N-type surface layer. A PN junction is formed at the interface between the N-type surface layer and the P-type bulk of the slice. One major surface is then coated with an acid resist such as wax, and the slice is etched to remove the N-type layer on the exposed surfaces. Alternatively, the process may begin with the N-type silicon slice, and an acceptor such as boron may be introduced by heating the silicon in vapors of boron trichloride. A PN junction may alternatively be prepared by diffusing an acceptor such as boron and a donor such as phosphorus into opposite major faces of an intrinsic silicon wafer.

A thin film of metal is then deposited by any convenient method over the entire surface of the silicon slice. In this example, the metal is nickel, and deposition is accomplished by an electroless nickel plating technique as follows. The wafer is treated in a solution consisting of 30 grams per liter nickel chloride, 10 grams per liter sodium hyposulfite, 65 grams per liter ammonium citrate, 50 grams per liter ammonium chloride, and sufficient ammonium hydroxide to make the solution blue in color. The plating stops when the silicon surface is completely covered with nickel. If desired, the adherence of the nickel to the silicon may be improved by sintering the nickel for about 5 minutes at about 600° C. in an atmosphere of hydrogen or forming gas. After the sintering, a second film of electroless nickel is deposited over the surface.

Next, the silicon slice is placed in a masking jig so as to expose a predetermined pattern in registry on the opposite major wafer faces. In this example, the exposed areas of the pattern consist of an array of hexagons .070 inch in height. The spaces between the hexagons are lines .010 inch wide. A suitable acid resist is sprayed over the wafer so as to cover the hexagonal areas only, the spaces between the hexagons being protected by the masking jig. In this example, the resist consists of wax dissolved in toluene.

The wafer is then removed from the jig, and treated for about 6 to 8 seconds in an etchant consisting of 4 volumes nitric acid and 1 volume hydrofluoric acid. The composition of the etchant is not critical, and a solution of 9 parts nitric acid to 1 part hydrofluoric acid is also satisfactory. This brief treatment is sufficient to completely remove those portions of the nickel film (the spaces between the hexagons) which were not protected by the resist. The wax resist is removed by treating the wafer with an organic solvent. In this example, the solvent is carbon tetrachloride but other solvents such as toluene or trichloroethylene are equally efficacious. After the resist is removed, the silicon wafer is left with a pattern of nickel-covered hexagons in registry on opposite major faces, and is ready for dipping in a molten metal such as lead.

In this example, the silicon slice is dipped in molten solder containing 40% lead and 60% tin. The composition of the solder is not critical. The molten solder does not "wet" the exposed silicon, and hence does not adhere to it, but does "wet" the nickel-covered hexagonal portions of the wafer surface, and forms a solder coating on these areas which is relatively thick compared to the thickness of the nickel film.

The silicon wafer is now diced by immersion for about 5 minutes in a beaker of etchant. In this example, the etchant consists of 4 volumes nitric acid to 1 volume hydrofluoric acid, but the exact composition of the etchant is not critical, and may vary from 1 volume nitric acid to 9 volumes nitric acid per volume of hydrofluoric acid. During this step the exposed portions of the silicon are dissolved, and the wafer separates into a plurality of pellets, whose opposite major surfaces are coated with solder, each pellet being a hexagon .070 inch high. The beaker is decanted through a screen, and the pellets are washed with distilled water, then mounted and cased by conventional techniques. An advantage of this invention is that the pellets are easily mounted on a base plate by means of the solder coating over the major pellet faces. An electrical connection may be readily made to either the P-type or the N-type region of each pellet by soldering a wire to one of the solder-coated pellet faces.

Figure 3:
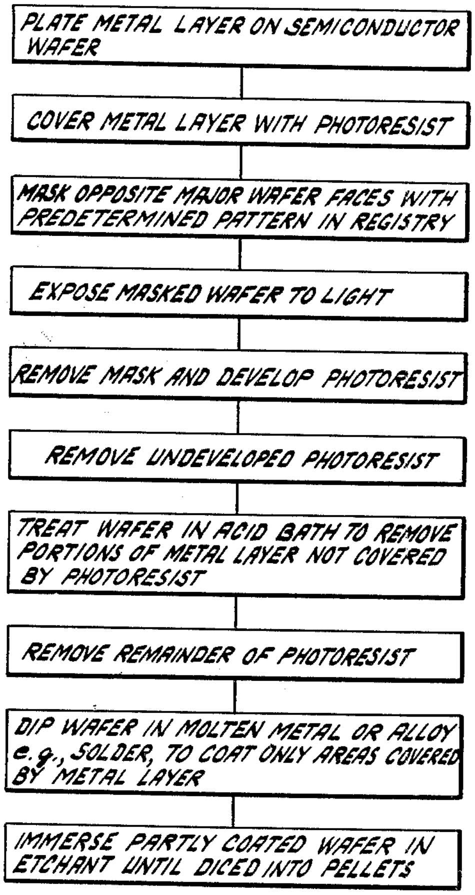
FIGURE 3 is a chart indicating the principal steps in another embodiment of the methods of the invention.

Another embodiment of the invention is represented in FIGURE 3. This embodiment will be described with reference to the fabrication of gallium arsenide diodes as an example. A slice about 6 mils thick is prepared from a monocrystalline ingot of gallium arsenide, and a PN junction is introduced. A metal film is deposited over the entire surface of the wafer. In this example, the metal is silver, and deposition is affected by electroplating.

Next the gallium arsenide slice is sprayed with a suitable photoresist. The wafer is then placed in a masking jig so as to expose to light a predetermined pattern in registry on opposite major wafer faces. In this example, the exposed areas of the pattern consist of an array of squares 50 mils on edge, with unexposed lines 10 mils wide between the squares. The photoresist is then developed, and the undeveloped portion removed, leaving a pattern of square areas which are covered by the photoresist and are in registry on the opposite major faces of the slice.

The wafer is then immersed for about 10 seconds in a bath consisting of equal volumes of nitric acid and hydrochloric acid. Those portions of the silver film which are not covered by the photoresist, i.e., the lines between the squares, are removed by this treatment. The wafer is then washed in distilled water, and the remainder of the photoresist is removed, leaving the wafer with silver-covered squares on opposite faces and ready for dipping in a molten metal or solder.

In this example, the gallium arsenide slice is dipped in molten solder consisting of 99% lead and 1% tin, which may be kept at about 350° C. The particular composition of the solder is not critical, and solders which contain less than one-half lead may also be employed. The molten solder does not "wet" the exposed gallium arsenide, but does "wet" the silver-covered square areas on the wafer surface and forms a solder coating thereon which is relatively thick compared to the thickness of the silver film.

The gallium arsenide wafer is now diced by immersion for about 5 minutes in a beaker of etchant. In this example the etchant consists of 1 volume concentrated nitric acid, 1 volume concentrated hydrofluoric acid, and 1 volume distilled water. The exact etchant composition is not critical, since any mixture which will attack and dissolve gallium arsenide in preference to solder may be used. During this step the exposed areas of the wafer are dissloved, so that the wafer separates into a plurality of gallium arsenide pellets coated with solder on opposite major faces, each pellet being a square 50 mils on edge. The pellets are washed in distilled water, then mounted and encapsulated by conventional techniques.

While the device thus made is a diode rectifier, it will be understood by those skilled in the art that the invention may also be utilized to fabricate unipolar devices, and multijunction devices such as transistors. Other modifications may be made without departing from the spirit and scope of the invention. For example, electroless cobalt films may be used in place of electroless nickel. Alternatively, a thin film of copper, or one of the noble metals, such as gold and platinum may be plated instead of silver. Another modification consists of removing the unwanted portions of the metal film by mechanical means, such as lapping or grinding.

There have thus been described improved methods of dicing semiconductor wafers into pellets of any desired shape, which methods are broadly adaptable to any solid crystalline semiconductive material.

What is claimed is:

1. The process of dicing a slice of semiconductive material into pellets, comprising the steps of metalizing predetermined areas in registry on opposite faces of said slice with a thin coating of a metal selected from the group consisting of cobalt, nickel, rhodium, palladium, iridium, platinum, copper, silver and gold, dipping said slice in molten solder which coats only said metallized areas on said slice, said solder being selected from the group consisting of lead, tin and lead-tin alloys, and immersing said slice in an etchant relatively inert with respect to said solder thereby to dissolve the portions of said slice between said solder-coated areas and produce a plurality of pellets coated with said metallic coating and said solder.

2. The process as in claim 1, wherein said semiconductive material is silicon and said metal is nickel.

3. The process of dicing a slice of semiconductive material into pellets, comprising the steps of removably masking opposite major faces of said slice so as to expose predetermined areas in registry on said faces, depositing a metal film on said exposed areas, said metal being selected from the group consisting of cobalt, nickel, rhodium, palladium, iridium, platinum, copper, silver and gold, removing said mask, dipping said slice in molten solder to coat said predetermined areas with said solder, and immersing said slice in an etchant for said semiconductor so as to dissolve the portions of said slice outside said solder-coated areas and produce a plurality of pellets coated with said metal film and said solder.

4. The process as in claim 3, in which said metal film is deposited by vacuum evaporation.

5. In the fabrication of semiconductor devices by dicing a semiconductive wafer into pellets, the improvement comprising the steps of depositing a metal film on said wafer, said metal being selected from the group consisting of cobalt, nickel, rhodium, palladium, iridium, platinum, copper, silver and gold, masking opposite major wafer faces so as to expose predetermined areas in registry on said faces, spraying said wafer with an acid resist so as to cover said exposed areas, treating said wafer in an acid bath so as to remove the previously masked portion of said metal film, removing said acid resist, dipping said wafer in molten solder so as to solder coat said predetermined areas, and immersing said wafer in an etchant which is relatively inactive with respect to said solder, whereby the portions of said wafer between said solder coated areas are dissolved, leaving a plurality of solder coated semiconductive pellets whose size and shape corresponds to said predetermined areas.

6. In the fabrication of semiconductor devices by dicing a silicon wafer into pellets, the improvement comprising the steps of depositing a nickel film on said wafer, masking opposite wafer faces so as to expose predetermined areas in registry on said face, spraying said wafer with an acid resist so as to cover said exposed areas, treating said wafer in an acid bath so as to remove the portion of said film not covered by said resist, removing said acid resist, dipping said wafer in molten lead so as to coat said predetermined areas, and immersing said wafer in an etchant including hydrofluoric acid, whereby the portions of said wafer between said lead coated areas are dissolved, leaving a plurality of lead coated silicon pellets whose size and shape correspond to said predetermined areas.

7. The process as in claim 6, in which said nickel film is deposited by plating.

8. In the fabrication of semiconductor devices by dicing a semiconductive wafer into pellets, the improvement comprising the steps of depositing a metal film on said wafer, coating said wafer with a photographic resist, masking opposite major wafer faces so as to expose to light predetermined areas in registry on said wafer, developing said exposed areas of said resist, removing the unexposed resist, treating said wafer in an acid bath so as to remove those portions of said metal film not covered by said resist, removing said developed resist, dipping said wafer in molten solder so as to coat said predetermined areas, and immersing said wafer in an etchant which is relatively inactive with respect to said solder, whereby the portions of said wafer between solder coated areas are dissolved, leaving a plurality of solder coated semiconductive pellets whose size and shape correspond to said predetermined areas.

9. In the fabrication of semiconductor devices by dicing a gallium arsenide wafer into pellets, the improvement comprising the steps of plating a silver layer on said wafer, coating said wafer with a photographic resist, masking opposite major wafer faces so as to expose to light predetermined areas in registry on said wafer, developing said exposed areas of said resist, removing the unexposed resist, treating said wafer in an acid bath so as to remove those portions of said silver layer not covered by said resist, removing said developed resist, dipping said wafer in molten solder so as to coat said predetermined areas, and immersing said wafer in an etchant including hydrofluoric acid, whereby the portions of said wafer between said solder coated areas are dissolved, leaving a plurality of solder coated gallium arsenide pellets whose size and shape correspond to said predetermined areas.

References Cited in the file of this patent

UNITED STATES PATENTS

| | | |
|---|---|---|
| 2,235,051 | Thompson | Mar. 18, 1941 |
| 2,321,523 | Saslaw | June 8, 1943 |
| 2,536,383 | Mears et al. | Jan. 3, 1951 |
| 2,743,506 | Solow | May 1, 1956 |
| 2,758,074 | Black | Aug. 7, 1956 |
| 2,777,192 | Albright et al. | Jan. 15, 1957 |
| 2,829,460 | Golay | Apr. 8, 1958 |

OTHER REFERENCES

Steel, vol. 141, No. 21, pp. 153–6, Nov. 18, 1957.

Remy: Treatise on Inorganic Chemistry, vol. 1, page 472 (1956).